United States Patent
Xu et al.

(10) Patent No.: US 7,641,496 B2
(45) Date of Patent: Jan. 5, 2010

(54) ZIF SOCKET CONNECTOR HAVING IMPROVED GUIDING MECHANISM SYSTEM

(75) Inventors: Zhan-Jun Xu, ShenZhen (CN); Chi-Nan Liao, Tu-cheng (TW); Qing-Feng Wang, ShenZhen (CN); Fu-Jing Peng, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/148,978

(22) Filed: Apr. 24, 2008

(65) Prior Publication Data

US 2008/0268664 A1 Oct. 30, 2008

(30) Foreign Application Priority Data

Apr. 24, 2007 (CN) .................... 200720037158.1

(51) Int. Cl.
*H01R 4/50* (2006.01)
(52) U.S. Cl. ..................................................... 439/342
(58) Field of Classification Search ................. 439/259, 439/342
See application file for complete search history.

(56) References Cited

U.S. PATENT DOCUMENTS

| 6,609,926 | B1 | 8/2003 | Chen et al. | |
|---|---|---|---|---|
| 6,814,603 | B2 * | 11/2004 | Okita et al. | 439/342 |
| 7,056,140 | B1 * | 6/2006 | Jiang | 439/342 |

* cited by examiner

*Primary Examiner*—Tho D Ta
(74) *Attorney, Agent, or Firm*—Andrew C. Cheng; Wei Te Chung; Ming Chieh Chang

(57) ABSTRACT

An electrical connector (1) of the present invention includes an insulative base (10) defining a plurality of passageways (101) to receive a plurality of conductive terminals (19) therein, a base plate (142) retained in the insulative base, a cover (12) movably assembled on the base, a cover plate (142) retained in the cover and a cylindrical actuator (16). The base defines a through hole (1021) thereof. The base plate defines a through hole (1421) and a guiding slot (1422). The cover defines a plurality of passages (124) corresponding to the passageways of the insulative base and a through hole (123). The cover plate defines a through hole (1411) and a guiding portion (1413) sliding in the guiding slot. The cylindrical actuator is received and rotating in said through holes. At least one inner edge of the through hole of the base plate extends outwards to form an edge portion with a smooth surface thereon.

12 Claims, 5 Drawing Sheets

ZIF SOCKET CONNECTOR HAVING IMPROVED GUIDING MECHANISM SYSTEM

BACKGROUND OF THE INVENTION

1. Field of the Invention

The present invention generally relates to a zero insertion force (ZIF) electrical connector, and more particularly, to a socket connector having an improved guiding device arranged between a base and a cover so as to efficiently drive the cover to move along the base.

2. Description of the Prior Art

U.S. Pat. No. 6,609,926 issued to Chen on Aug. 26, 2003 discloses a socket connector for connecting an IC package, such as a CPU to a printed circuit board (PCB). The socket connector 2 as shown in FIG. 1 includes an insulating base 20, a plurality of terminals 28 arranged in the base 20, a cover 22 movably assembled on the base 20, an anti-rotation mechanism 24 and an actuator 26. The actuator 26 drives the cover 22 to slide on the insulating base 20. The anti-rotation mechanism 24 includes a generally T-shaped metal cover plate 241 and a metal base plate 242 defining a through hole 2421 therein. The cover plate 241 is integrally insert-molded with the cover 22, the base plate 242 is disposed in the recess 201 of the base 20. When the socket connector 2 is assembled, the actuator 26 is rotated to drive the cover 22 to slide along the base 20.

When the actuator 26 is driven to rotate, it firstly needs to overcome a great deal of friction force resulted from the coarse inner surface of the through hole 2421. Therefore, the user needs to exert a comparable higher driving force to rotate the actuator 26 so as to drive the cover 22 to move along the base 20. Hence, a new design which can reduce operating force is required.

SUMMARY OF THE INVENTION

Accordingly, an object of the present invention is to provide a socket connector that can overcome the above-mentioned problem.

In order to achieve the object set forth, a socket connector of the present invention includes an insulative base defining a plurality of passageways to receive a plurality of conductive terminals therein, a base plate retained in the insulative base, a cover movably assembled on the base, a cover plate retained in the cover and a cylindrical actuator. The base defines a through hole thereof. The base plate defines a through hole and a guiding slot. The cover defines a plurality of passages corresponding to the passageways of the insulative base and a through hole. The cover plate defines a through hole and a guiding portion sliding in the guiding slot. The cylindrical actuator is received and rotating in said through holes. At least one inner edge of the through hole of the base plate extends outwards to form an edge portion with a smooth surface thereon.

Other objects, advantages and novel features of the invention will become more apparent from the following detailed description of the present embodiment when taken in conjunction with the accompanying drawings.

DETAILED DESCRIPTION OF THE INVENTION

Figure 1:
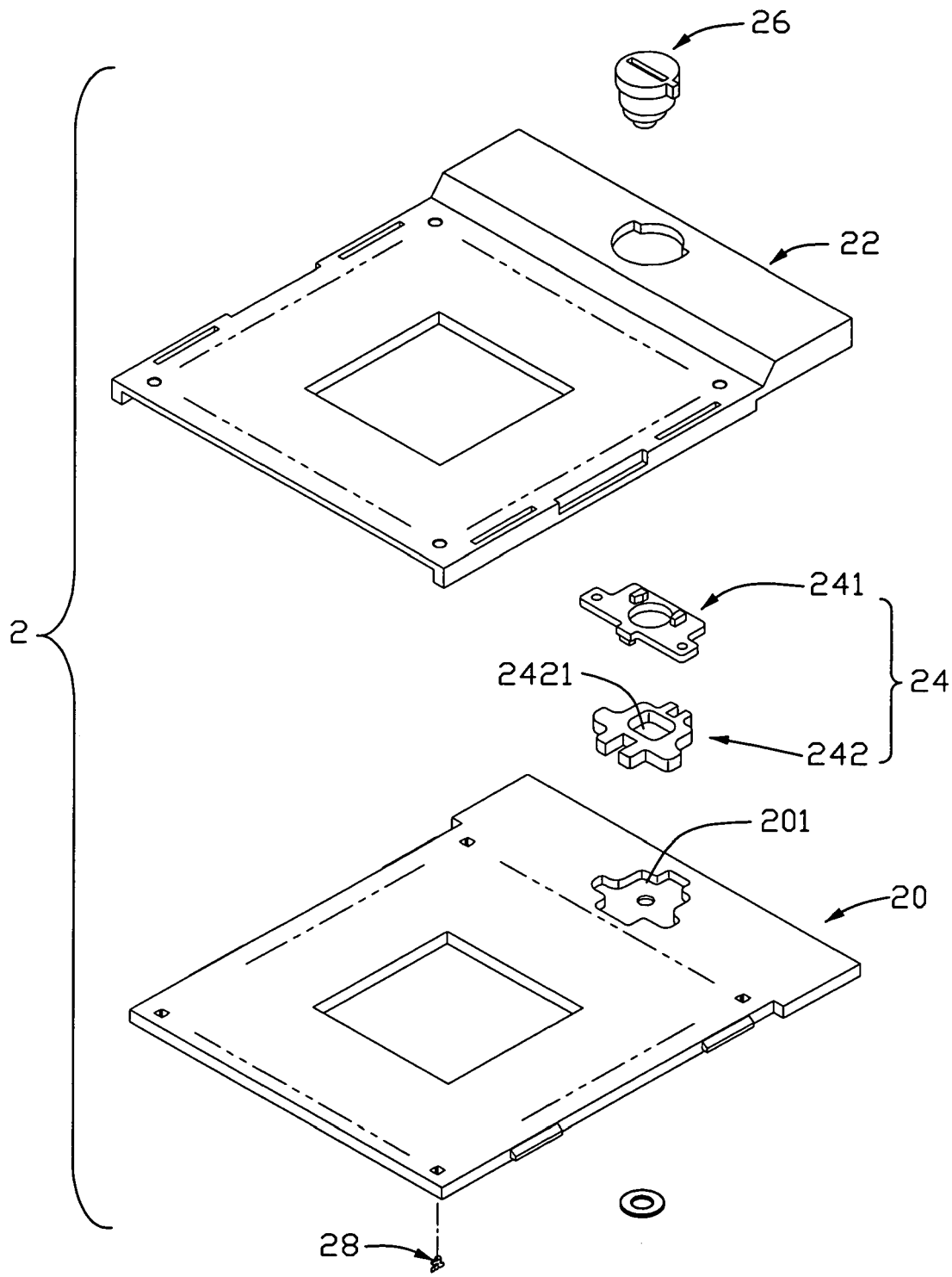
FIG. 1 is a simplified exploded view of a conventional socket connector.

Reference will now be made to the drawing figures to describe a preferred embodiment of the present invention in detail.

Figure 2:
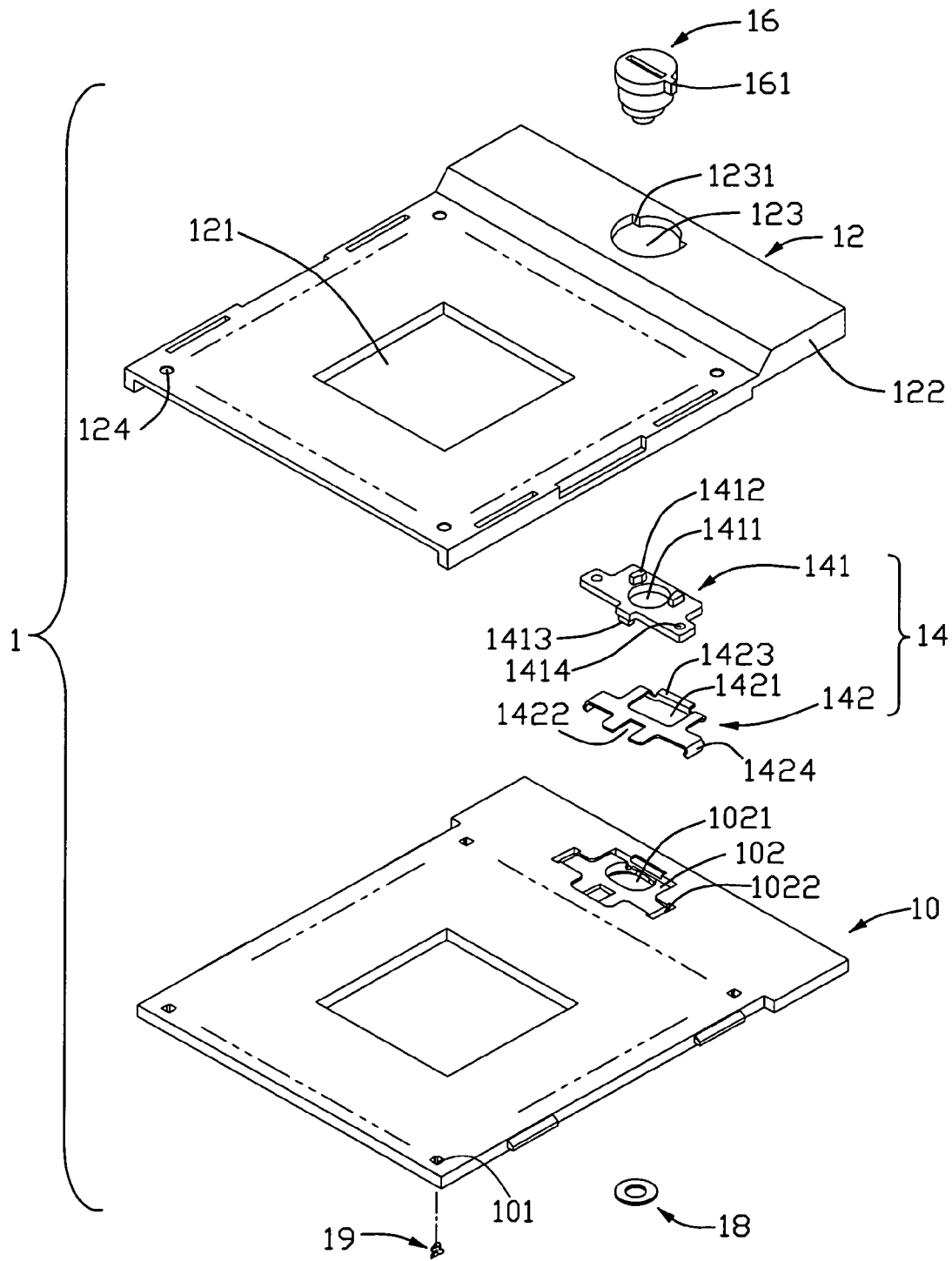
FIG. 2 is a simplified exploded view of a socket connector in accordance with a preferred embodiment of the present invention.

Referring to FIG. 2, a ZIF socket connector in accordance with the present invention is adapted for electrically connecting an IC package, such as a CPU to a PCB (not shown). The socket connector 1 includes an insulative base 10 mounted with a plurality of terminals 19 thereon, a cover 12 movably assembled on the base 10, a guiding mechanism 14 locating between the base 10 and the cover 12 and an actuator 16.

The base 10 is generally rectangular. A plurality of passageways 101 is defined in the base 10. The plurality of passageways 101 form a rectangular array, and the plurality of conductive terminals 19 are received in the passageways 101. A first recess 102 of cross-shape is defined in a middle portion of one end of the base 10. An elliptical through hole 1021 runs through the first recess 102 along upright direction, for receiving the actuator 16.

The cover 12 defines a square opening 121 in a centre portion thereof, and a ledge portion 122 at one end thereof. A through hole 123 is defined in a middle portion of the ledge portion 122, corresponding to the through hole 1021 of the base 10. The through hole 123 is formed by two semicircular inner edges of different radius. Accordingly, a pair of spaced stop edges 1231 is formed at the inner side of through hole 123. A plurality of passages 124 is defined in the cover 12, corresponding to the passageways 101 of the base.

The guiding mechanism 14 includes a generally T-shaped metal cover plate 141 and a metal base plate 142. The cover plate 141 defines a circular through hole 1411 in a middle portion thereof and a pair of stop portions 1412 extending upwardly and adjacent to the through hole 1411. The stop portions 1412 are chamfered at the inner side to correspond to a proximate curvature of the through hole 1411. The cover plate 141 further defines a pair of small fixing holes 1414 in opposite ends thereof for facilitating insert-molding of the cover plate 141 in a second recess (not shown) of the cover and a guiding portion 1413 extending downwards from a bottom thereof.

Figure 4:
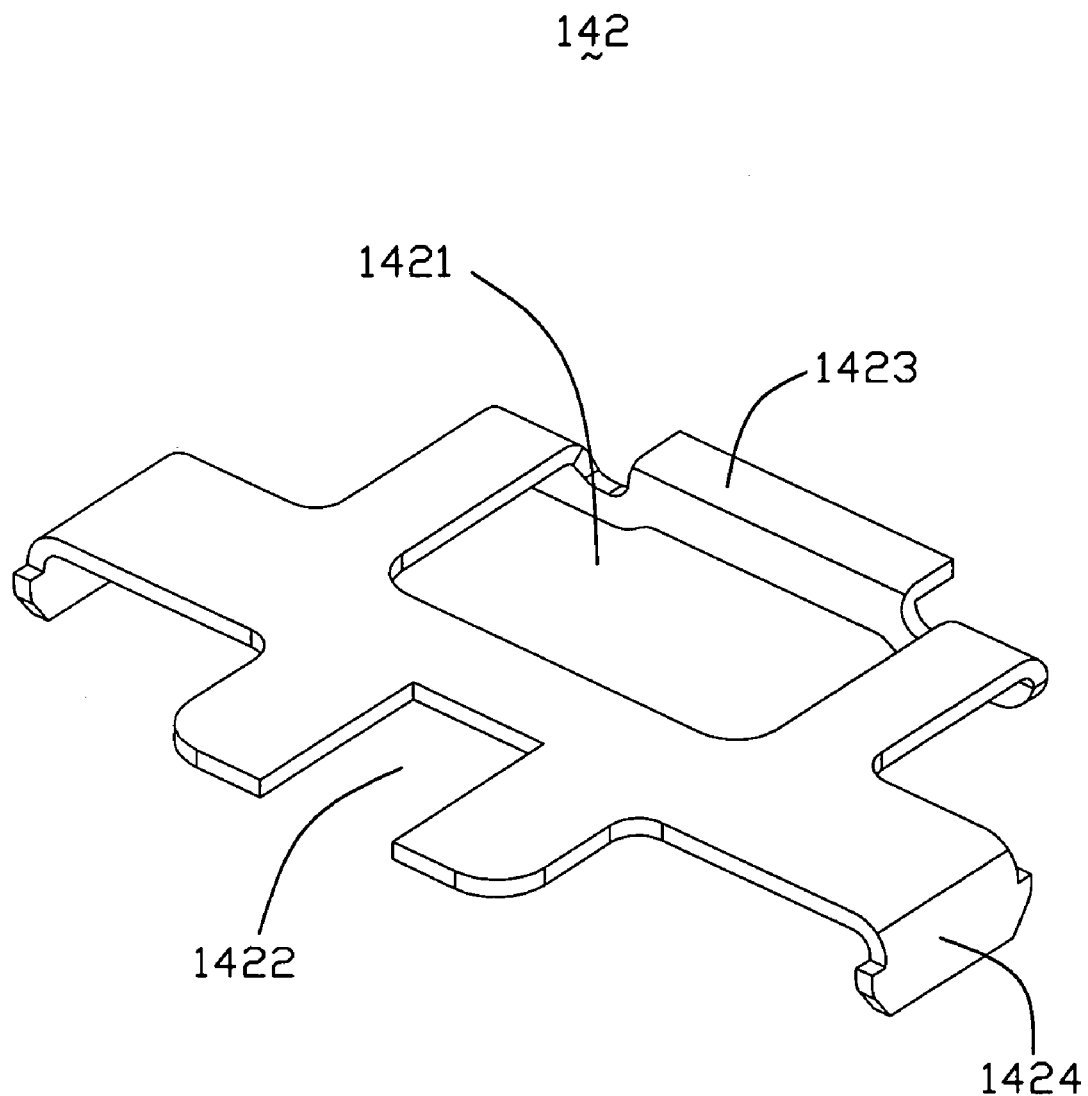
FIG. 4 is a perspective view of the base plate of the socket connector shown in FIG. 2.
Figure 5:
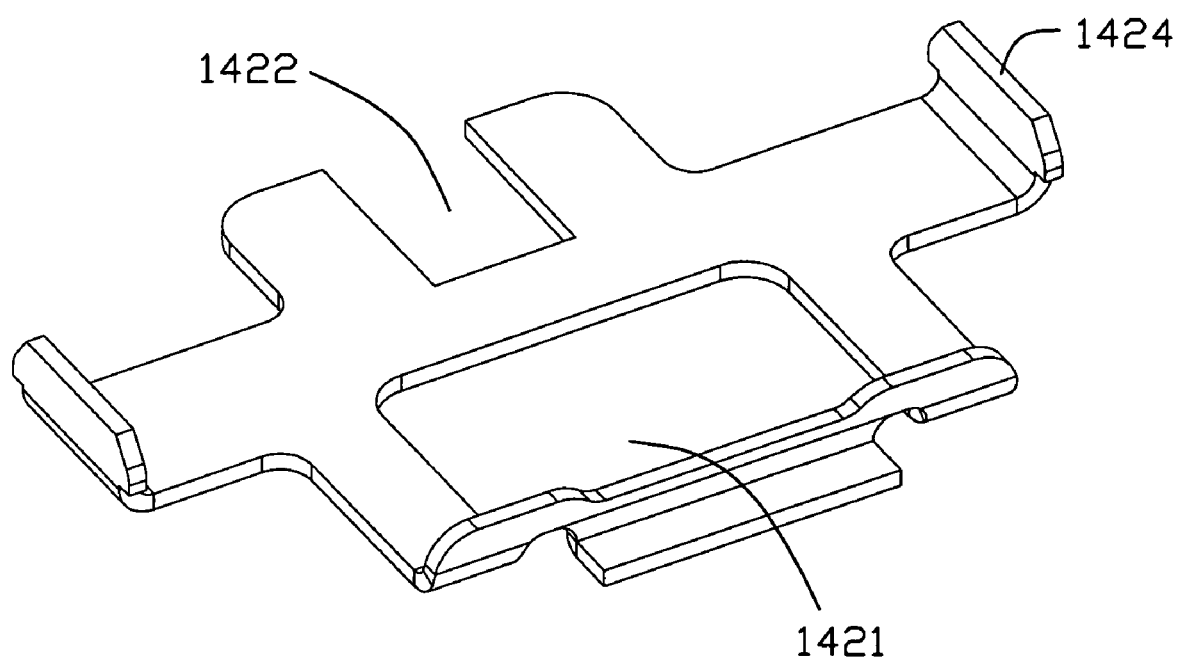
FIG. 5 is another perspective view of the base plate shown in FIG. 4.

Referring to FIG. 4 and FIG. 5, the base plate 142 defines a rectangular through hole 1421 in a middle portion thereof and a guiding slot 1422 at one side thereof and perpendicular to the through hole 1421, corresponding to the guiding portion 1413. A back inner edge opposite to the guiding slot 1422 of the through hole 1421 further extends upwardly and then backwardly to form an edge portion with thereon a smooth surface 1423 downwardly bent from a primary horizontal plane (not labeled) of the base plate, which is parallel to the base 10. The edge portion extends out of the through hole 1421 and the smooth surface 1423 is provided to contact with the actuator 16. The cover plate 141 is insert-molded in the cover 12, and the base plate 142 is retained in the first recess 102 of the base 10 with a pair of retaining portion 1424 retained in corresponding retaining slots 1022. The stop portions 1412 abut against the stop edges 1231.

The actuator 16 defines several cylindrical portions of different radius stacked one on another. The cylindrical portions progressively decrease in diameter from top to bottom. Center axes of the different cylindrical portions are offset from each other. A lateral protrusion 161 protrudes from a circumferential periphery of the topmost cylindrical portion.

Figure 3:
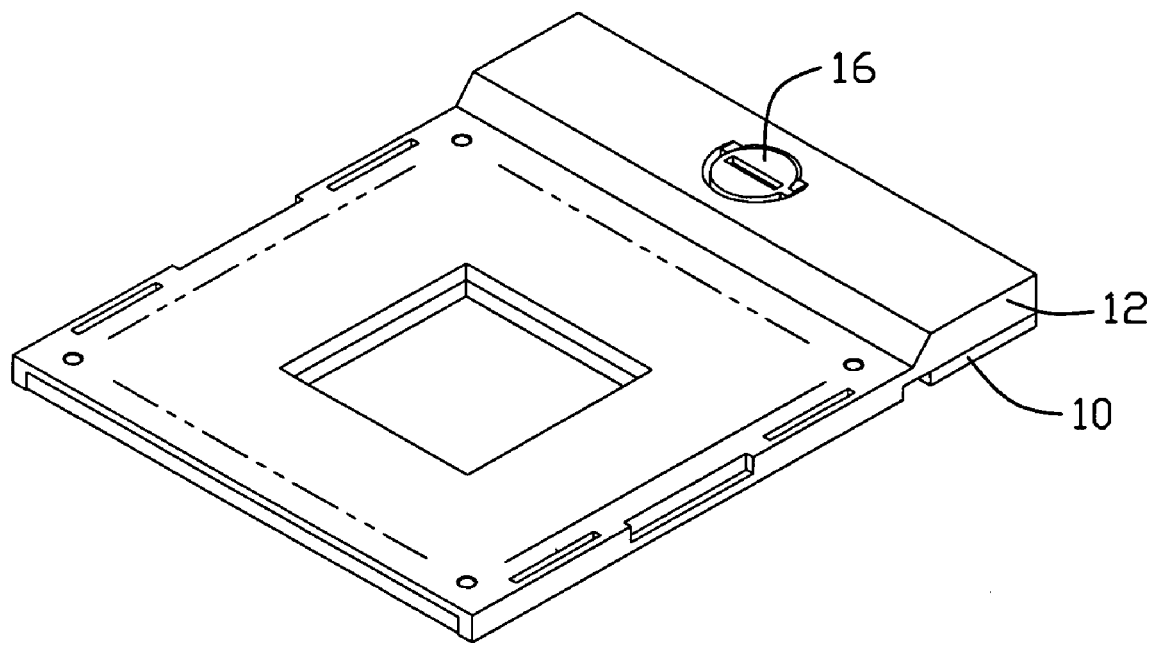
FIG. 3 is an assembled perspective view of the socket connector shown in FIG. 2.

The actuator 16 is received in corresponding through holes 123, 1411, 1421 and 1021. The bottom end of the actuator 16 protrudes beyond the base portion 10 and is riveted with a pad 18 to secure the actuator 16 in the socket connector 1 (as shown in FIG. 2 and FIG. 3). Rotation of the protrusion 161 is restricted between the two stop portions 1412. Thus a distance along which the cover 12 slide is limited. The actuator 16 is rotated by an exterior force to urge the cover plate 141 to move in a front-to-rear direction by the limitation of the guiding slot 1422. Then, the cover 12 together with the cover plate 141 is urged to move in the front-to-rear direction. The cylindrical portions of the actuator 16 will rotate in corresponding through holes, wherein friction is produced between the cylindrical portion and the inner side of the through hole 1421. The smooth surface 1423 is smooth so that the coefficient of friction between the cylindrical portion and the smooth surface 1423 is reduced, and the friction may be reduced effectively. This ensures that the operating of the actuator 16 is easy and the cover 12 slides along the base 10 safely. The bend of the edge portion can enhance the rigidity of the edge portion, and also can prevent burrs from being produced while the through hole 1421 is pressed in the base plate 142.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for connecting an IC package to a printed circuit board (PCB), comprising:
    an insulative base defining a plurality of passageways to receive a plurality of conductive terminals therein, and a through hole thereof;
    a base plate retained in the insulative base, defining a through hole and a guiding slot;
    a cover movably assembled on the base, defining a plurality of passages corresponding to the passageways of the insulative base and a through hole;
    a cover plate defining a through hole and a guiding portion, the cover plate being retained in the cover and the guiding portion being sliding in the guiding slot; and
    a cylindrical actuator received and rotating in said through holes;
    wherein at least one inner edge of the through hole of the base plate extends outwards to form an edge portion with a smooth surface thereon, and the smooth surface is located at an inside face of the through hole of the base plate to engage with the actuator.

2. The electrical connector as described in claim 1, wherein the through hole of the base plate is defined in a middle portion thereof.

3. The electrical connector as described in claim 2, wherein an inner edge of the through hole of the base plate opposite to the guiding slot extends outwards to form the edge portion.

4. The electrical connector as described in claim 1, wherein the base defines a first recess in a middle portion of its one end, and the through hole defined in the base runs through the first recess along an upright direction.

5. The electrical connector as described in claim 4, wherein the first recess defines a pair of retaining slots recessed vertically to the base at opposite sides thereof, and the base plate is retained in the first recess by a pair of retaining portion bending downwards to engage with the corresponding retaining slots.

6. An electrical connector for connecting an IC package to a printed circuit board (PCB), comprising:
    an insulative base receiving a plurality of conductive terminals therein;
    a cover movably assembled on the base;
    a guiding mechanism, including a base plate arranged in the insulative base, and a cover plate arranged on the cover corresponding to the base plate of the insulative base, the base plate defining a through hole, and at least one inner edge of the through hole extending outwards to form an edge portion with a smooth surface located at an inside face of the through hole of the base plate thereon, and the cover plate defining a through hole corresponding to said through hole of the base plate; and
    an actuator running through the through holes of the base plate and the cover plate and engaging with the smooth surface while rotating therein.

7. The electrical connector as described in claim 6, wherein the through hole of the base plate is defined in a middle portion thereof.

8. The electrical connector as described in claim 7, wherein the base plate defines a guiding slot, an inner edge of the through hole of the base plate opposite to the guiding slot extends outwards to form the edge portion.

9. An electrical connector for connecting an IC package to a printed circuit board (PCB), comprising:
    an insulative base defining a plurality of passageways to receive a plurality of conductive terminals therein, and a first through hole thereof;
    a base plate retained in the insulative base and defining a second through hole and a guiding slot, and a horizontal primary plane which is essentially parallel to said base;
    a cover movably assembled on the base, and defining a plurality of passages corresponding to the passageways of the insulative base and a third through hole;
    a cover plate defining a through hole and a guiding portion, the cover plate being retained in the cover and the guiding portion being sliding in the guiding slot; and
    a cylindrical actuator received and rotating in said first, second and third through holes; wherein
    one inner rim of the second through hole, which confronts the actuator in a front-to-back direction, defines a smooth engagement plane which originally belongs to said horizontal primary plane while being bent in a vertical direction into a final shape thereof to engage said actuator.

10. The electrical connector as claimed in claim 9, wherein a dimension of said smooth engagement plane along said vertical direction is larger than a thickness of said base plate.

11. The electrical connector as claimed in claim 9, wherein said smooth plane is not a stamped edge of said base plate.

12. The electrical connector as claimed in claim 9, wherein said smooth engagement plane is downwardly bent in said vertical direction.

* * * * *